US012812789B2

(12) United States Patent
Lin

(10) Patent No.: US 12,812,789 B2
(45) Date of Patent: Nov. 24, 2026

(54) POWER SEMICONDUCTOR MODULE PACKAGING STRUCTURE

(71) Applicant: Chin-Feng Lin, New Taipei City (TW)

(72) Inventor: Chin-Feng Lin, New Taipei City (TW)

( * ) Notice: Subject to any disclaimer, the term of this patent is extended or adjusted under 35 U.S.C. 154(b) by 185 days.

(21) Appl. No.: 18/943,812

(22) Filed: Nov. 11, 2024

(65) Prior Publication Data

US 2026/0136466 A1 May 14, 2026

(51) Int. Cl.

*H05K 1/18* (2026.01)
*H05K 1/181* (2026.01)
*H10W 42/20* (2026.01)
*H10W 90/00* (2026.01)

(52) U.S. Cl.

CPC ............ *H05K 1/181* (2013.01); *H10W 42/20* (2026.01); *H10W 90/00* (2026.01); *H05K 2201/10166* (2013.01); *H05K 2201/10174* (2013.01); *H05K 2201/1031* (2013.01); *H05K 2201/10333* (2013.01)

(58) Field of Classification Search

CPC .. H05K 1/18; H05K 1/181; H05K 2201/1031; H10W 90/753; H10W 90/00; H10W 90/756

USPC .......................................................... 174/260

See application file for complete search history.

(56) References Cited

U.S. PATENT DOCUMENTS

| | | | | |
|---|---|---|---|---|
| 6,854,993 B1 * | 2/2005 | McHugh | H01R 12/88 | 439/487 |
| 2015/0092376 A1 * | 4/2015 | Arens | H05K 1/0256 | 361/767 |
| 2023/0246563 A1 * | 8/2023 | Kögler | H02M 7/003 | 257/706 |

* cited by examiner

*Primary Examiner* — Tremesha W Burns

(57) ABSTRACT

An improved power semiconductor module packaging structure includes a heat sink, a circuit substrate including at least one chip to constitute a power semiconductor module, a copper nut terminal selectively disposed on the heat sink or the at least one circuit substrate and electrically connected with the chip through wires and being used as a bridge between an external current and an internal current of the power semiconductor module, a plastic housing side wall defining therein a filling space, and an insulating glue injected into the filling space to cover the circuit substrate. The improved power semiconductor module packaging structure can significantly reduce electromagnetic radiation and is more suitable for large current applications.

7 Claims, 6 Drawing Sheets

100

POWER SEMICONDUCTOR MODULE PACKAGING STRUCTURE

BACKGROUND OF THE INVENTION

1. Field of the Invention

The present invention relates to a circuit board packaging structure, especially an improved power semiconductor module packaging structure used in the high current field.

2. Description of the Related Art

With the booming electronics industry, electronic products are also gradually moving towards multi-functions and high performance. Please refer to FIG. 1 and FIG. 2. FIG. 1 is a schematic diagram of the packaging structure of the power semiconductor module in the prior art. FIG. 2 is a three-dimensional exploded schematic diagram of the packaging structure of the power semiconductor module in the prior art. As shown FIG. 1 and FIG. 2, the three external connection terminals on the circuit board are rectangular sheets, and after passing through the three corresponding through holes on the outer shell, they are bent 90 degrees in the same direction for packaging. As a result, the entire volume is too large and because the external connection terminals are rectangular, the negative electromagnetic effect will be more obvious.

SUMMARY OF THE INVENTION

The present invention mainly provides an improved power semiconductor module packaging structure. The improved power semiconductor module packaging structure comprises a heat sink, at least one circuit substrate, at least one copper nut terminal, a plastic housing side wall and an insulating glue. The at least one circuit substrate is disposed on the heat sink. The at least one circuit substrate comprises at least one chip, which constitutes a power semiconductor module. The at least one copper nut terminal is selectively disposed on the heat sink or the at least one circuit substrate. The at least one copper nut terminal is used as a bridge between an external current and an internal current of the power semiconductor module. The at least one chip is electrically connected to the at least one copper nut terminal through a plurality of wires. The plastic housing side wall is disposed around the heat sink to define a filling space therein, wherein the height of the plastic housing side wall is lower than the height of the at least one copper nut terminal. The insulating glue is injected into the filling space to cover the at least one circuit substrate. The injection height of the insulating glue shall not exceed the height of the at least one copper nut terminal. The at least one copper nut terminal is used to conduct current.

In one embodiment of the present invention, the type of the at least one chip is one of the following: diode chip, metal oxide semiconductor (MOS) chip, bipolar junction transistor (BJT) chip, insulated gate bipolar transistor (IGBT) chip, or a combination of thereof.

In one embodiment of the present invention, the metal oxide semiconductor (MOS) chip, the bipolar junction transistor (BJT) chip, and the insulated gate bipolar transistor (IGBT) chip of the at least one chip are used as switches.

In one embodiment of the present invention, the number of the at least one copper nut terminal is plural.

In one embodiment of the present invention, at least one circuit substrate each further comprises at least one electronic component connected to the at least one chip to form the power semiconductor module.

The present invention also provides an alternate form of improved power semiconductor module packaging structure. This alternate form of improved power semiconductor module packaging structure comprises a heat sink, at least one circuit substrate, at least one copper nut terminal, a plastic housing side wall and an insulating glue. The at least one circuit substrate is disposed on the heat sink. The at least one circuit substrate each comprises at least one chip, which constitutes a power semiconductor module. The at least one copper nut terminal is selectively disposed on the heat sink or the at least one circuit substrate. The at least one copper nut terminalis used as a bridge between an external current and an internal current of the power semiconductor module. The at least one chip is electrically connected to the at least one copper nut terminal through a plurality of wires. The at least one copper nut terminal is used to conduct current. The plastic housing side wall is disposed around the heat sink to define a filling space therein. The height of the plastic housing side wall is lower than the height of the at least one copper nut terminal. The insulating glue is injected into said filling space to cover the at least one circuit substrate. The injection height of the insulating glue shall not exceed the height of the at least one copper nut terminal. The at least one chip each is a diode chip and is used for rectification.

The following is a detailed description through specific embodiments, so that the purpose, technical content, features and effects of the present invention can be more easily understood.

DETAILED DESCRIPTION OF THE PREFERRED EMBODIMENT

After years of research and development, the inventor has improved the shortcomings of existing products. The following will describe in detail how the present invention achieves the most efficient functional requirements with the improved power semiconductor module packaging structure.

Figure 1:
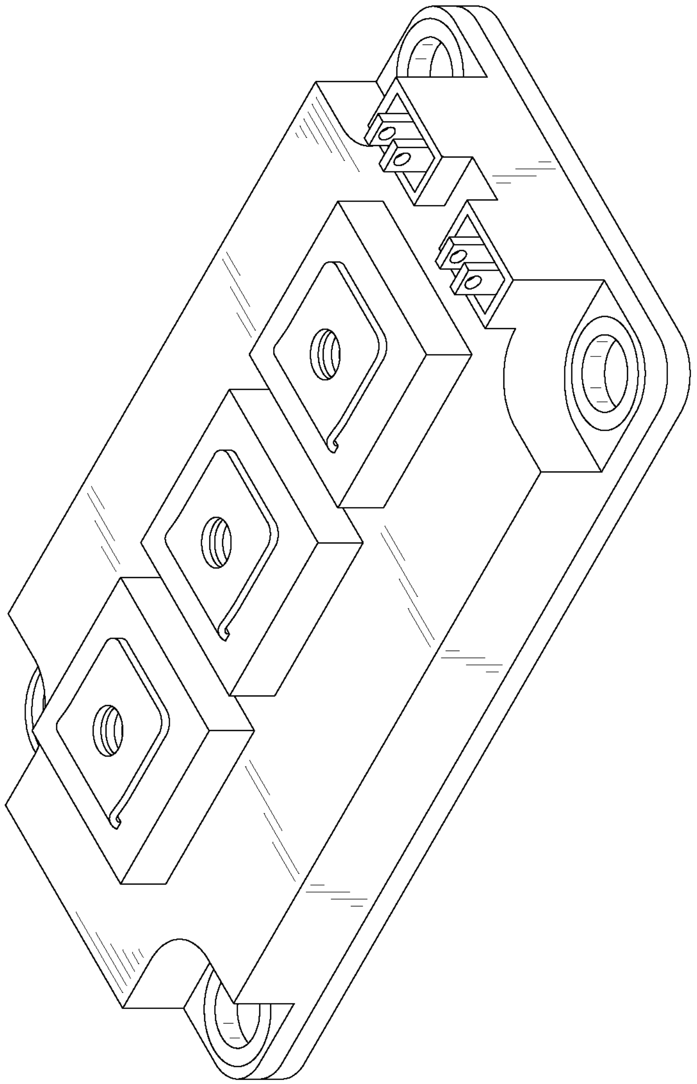
PRIOR ART FIG. 1
FIG. 1 is a schematic diagram of the packaging structure of the power semiconductor module in the prior art.
Figure 2:
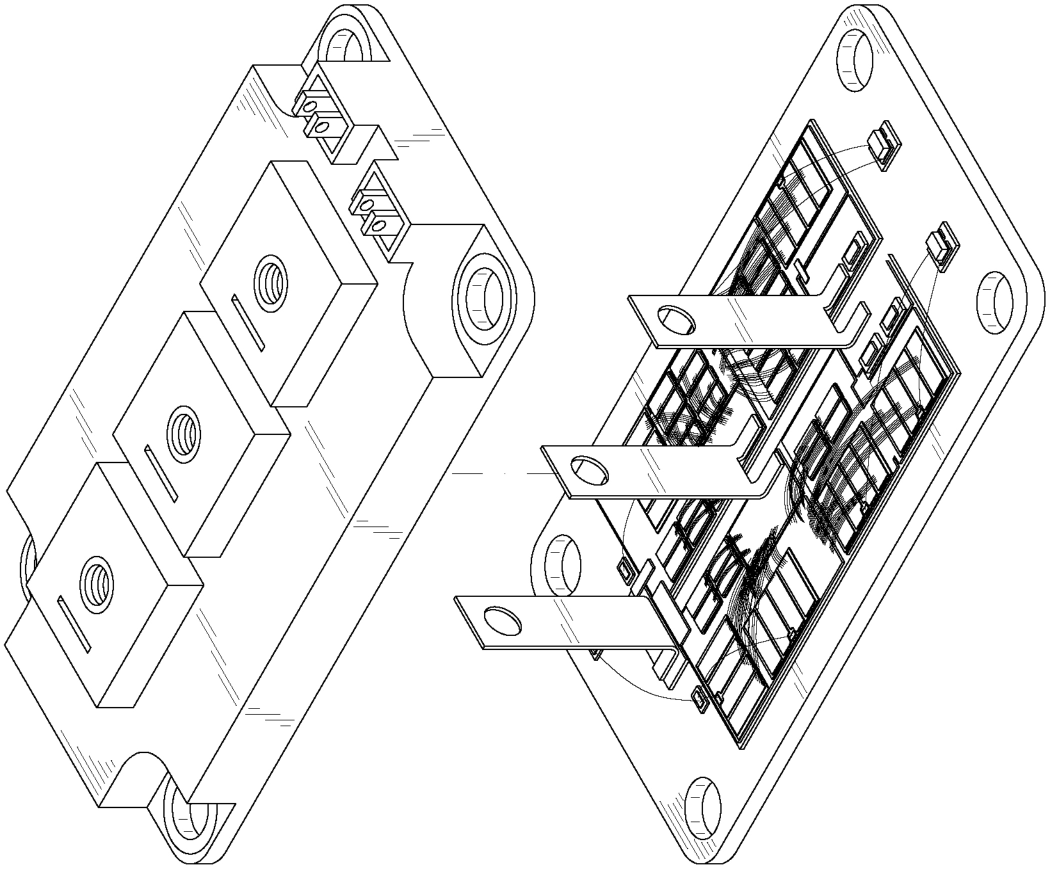
PRIOR ART FIG. 2
FIG. 2 is a three-dimensional exploded schematic diagram of the packaging structure of the power semiconductor module in the prior art.
Figure 3:
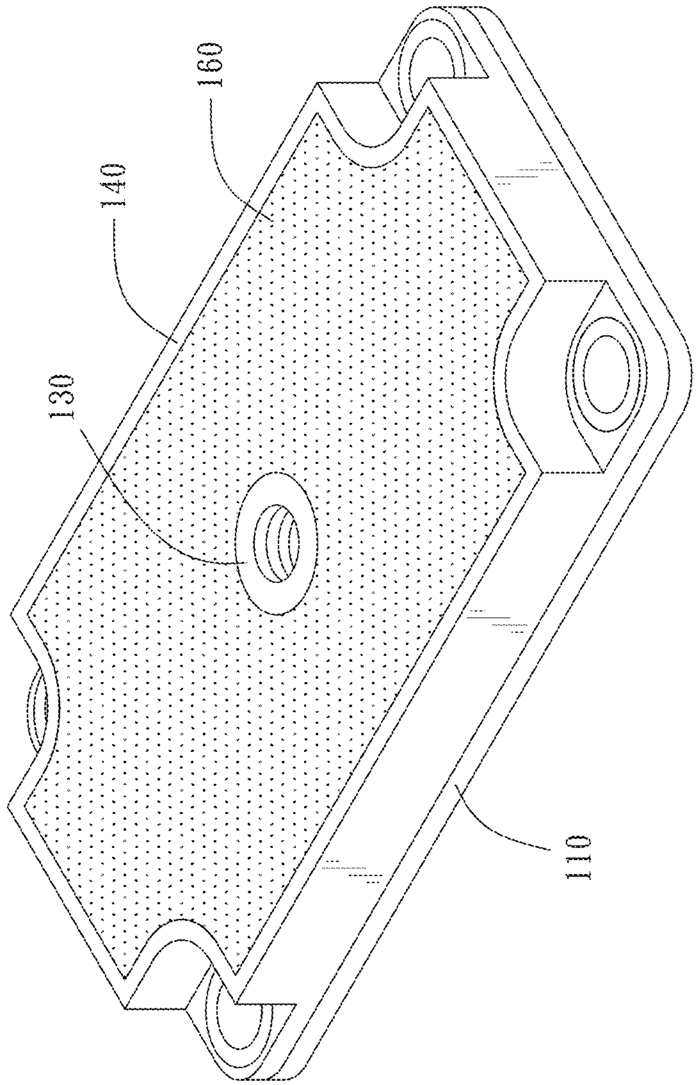
FIG. 3 is a schematic diagram of the improved power semiconductor module packaging structure of the present invention.
Figure 4:
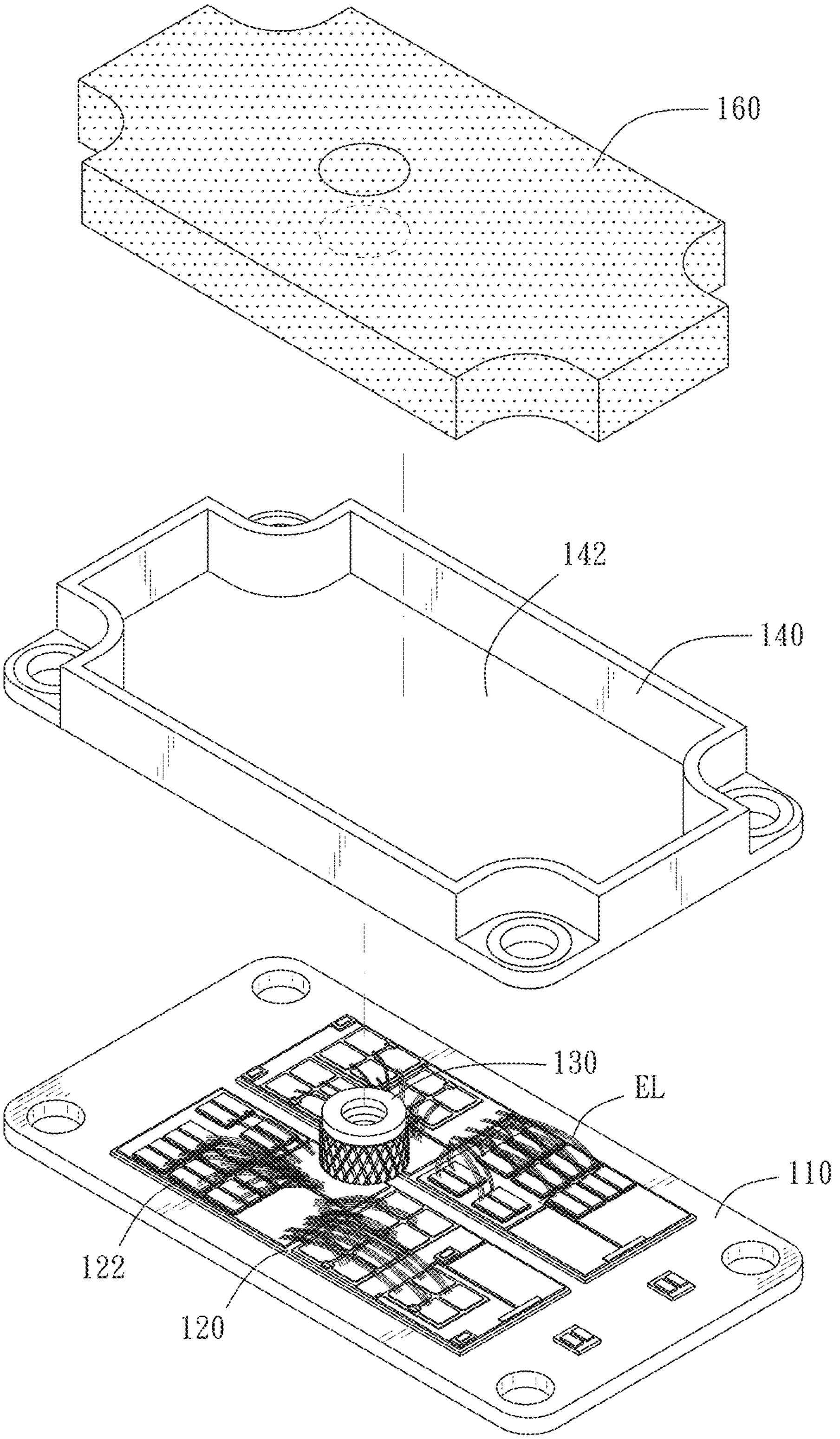
FIG. 4 is a partially exploded schematic diagram of a first embodiment of the improved power semiconductor module packaging structure of the present invention.
Figure 5:
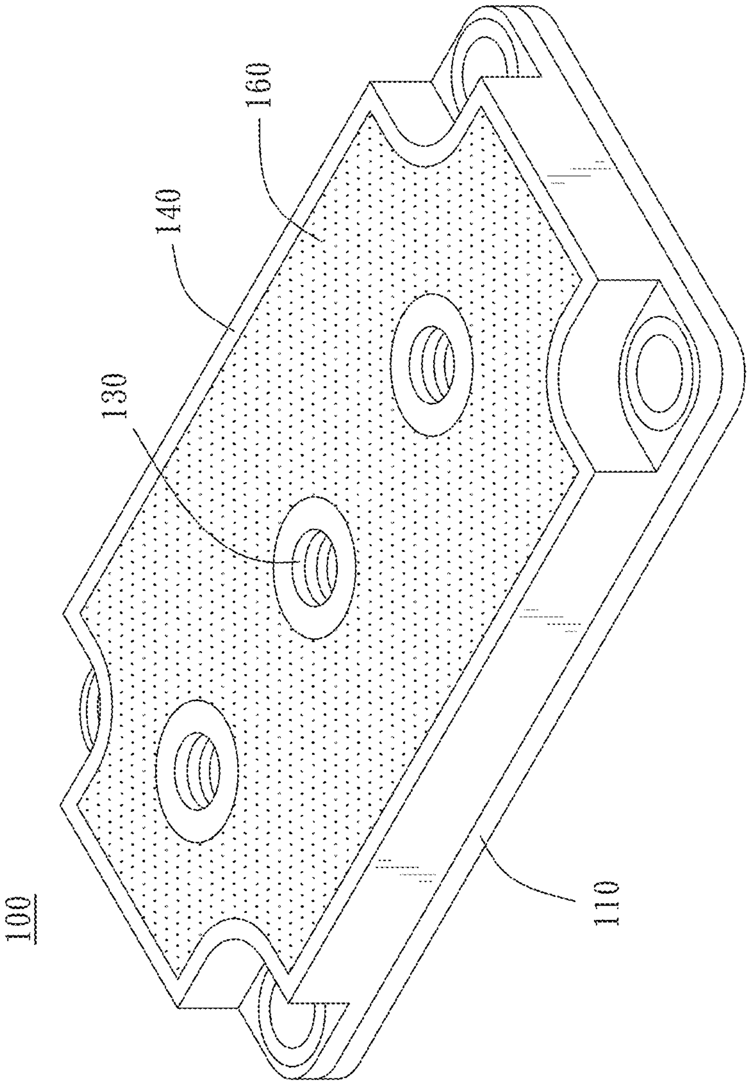
FIG. 5 is a schematic diagram of a second embodiment of the first embodiment of the improved power semiconductor module packaging structure of the present invention.
Figure 6:
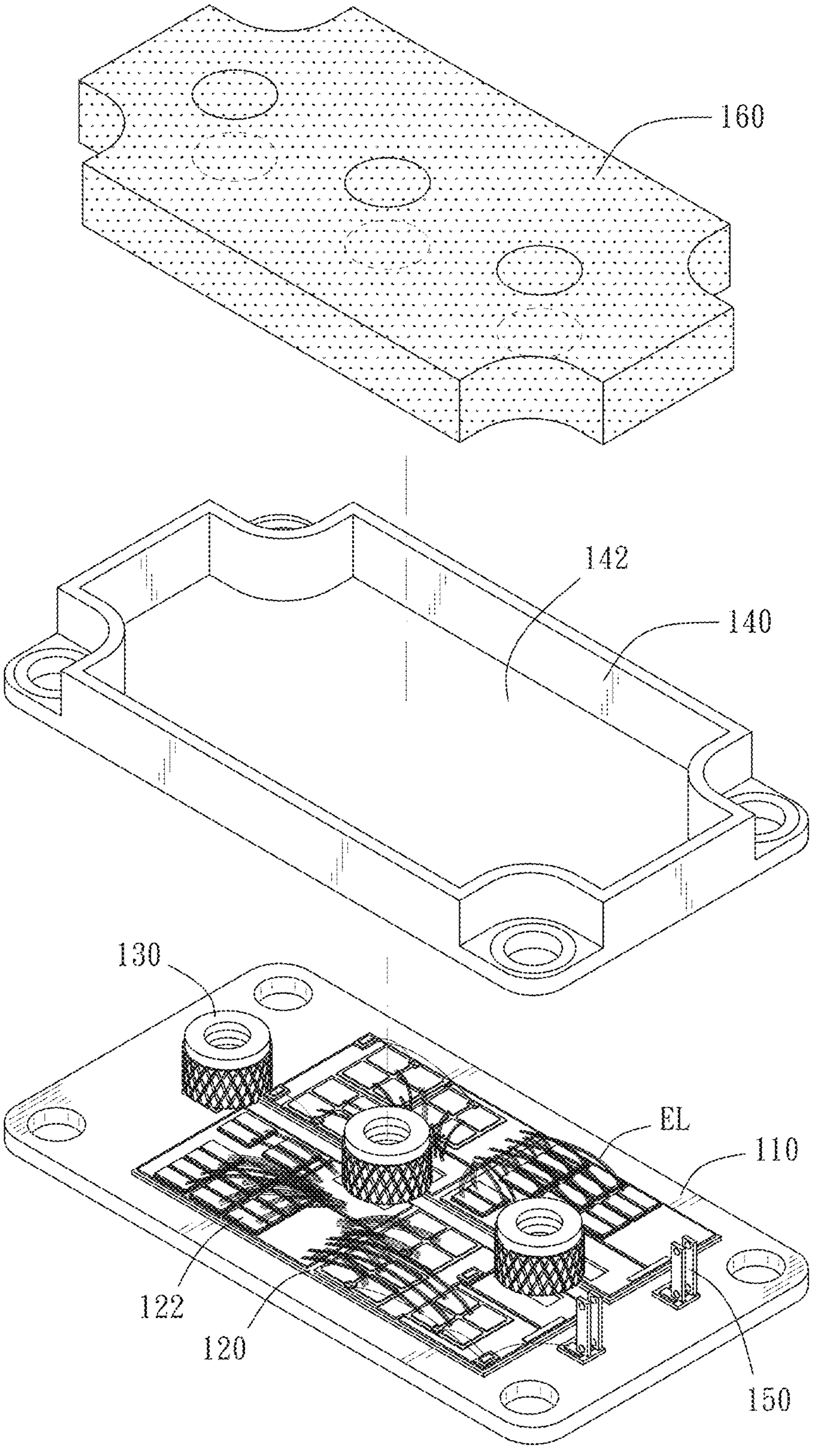
FIG. 6 is a partially exploded schematic diagram of the second embodiment of the improved power semiconductor module packaging structure of the present invention.

Please refer to FIGS. 3 to 6, where FIG. 3 is a schematic diagram of the improved power semiconductor module packaging structure of the present invention, FIG. 4 is a partially exploded schematic diagram of a first embodiment of the improved power semiconductor module packaging structure of the present invention, FIG. 5 is a schematic diagram of a second embodiment of the first embodiment of the improved power semiconductor module packaging structure of the present invention and FIG. 6 is a partially exploded schematic diagram of the second embodiment of the improved power semiconductor module packaging structure of the present invention.

As shown in the figures, the improved power semiconductor module packaging structure 100 comprises a heat sink 110, at least one circuit substrate 120, at least one copper nut terminal 130, a plastic housing side wall 140 and an insulating glue 160. The circuit substrate 120 is disposed on the heat sink 110. The circuit substrate 120 comprises at least one chip 122, which constitutes a power semiconductor module, wherein the circuit substrate 120 can be a ceramic circuit substrate. In another embodiment, the circuit substrate 120 further comprises at least one electronic component connected to the chip 122 to form the power semiconductor module. The copper nut terminal 130 is disposed on the heat sink 110 or the circuit substrate 120. The copper nut terminal 130 is used as a bridge between an external current and an internal current of the power semiconductor module, wherein the copper nut terminal is used to conduct the current. The chip 122 is electrically connected to the copper nut terminal 130 via a plurality of wires. The plastic housing side wall 140 is disposed around the heat sink 110 to form a closed shape, and a filling space 142 is formed inside the plastic housing side wall 140, wherein the height of the plastic housing side wall 140 is lower than the height of the copper nut terminal 130. The insulating glue 160 is injected into the filling space 142 to cover the circuit substrate 120, and the injection height of the insulating glue 160 does not exceed the height of the copper nut terminal 130. Furthermore, in another embodiment, a shell may be used to achieve a function similar to encapsulating the circuit substrate 120.

In the embodiment as shown in FIGS. 3 and 4, the types of the chips are diode chips, metal oxide semiconductor (MOS) chips, bipolar junction transistor (BJT) chips, insulated gate bipolar transistor (IGBT) chips, or various combinations thereof. The so-called various combinations refer to any two, any three, or all four types selected therefrom for combination. In addition, the types of these chips also include driver chips (driver ICs) that are used to drive chips with switching functions, such as, Metal Oxide Semiconductor (MOS) chips, Bipolar Junction Transistor (BJT) chips, or various combinations thereof. Furthermore, as shown in FIGS. 5 and 6, the above-mentioned metal oxide semiconductor (MOS) chips, bipolar junction transistor (BJT) chips, and insulated gate bipolar transistor (IGBT) chips are mainly used as switch functions, but are not limited to this. In addition, the diode chips of these chips are used for rectification function (such as full bridge or half bridge), but it is not limited to this. There is only one copper nut terminal 130 in the diagram, but it can be expanded to multiple copper nut terminals 130 (for example, three or more, such as the three shown in FIG. 6) to allow a larger current to pass through the diode chip to perform a rectification function, or to allow the Metal Oxide Semiconductor (MOS) chip, the Bipolar Junction Transistor (BJT) chip, and the Insulated Gate Bipolar Transistor (IGBT) chip to perform a switching function.

In addition, in this embodiment, as shown in FIG. 5 and FIG. 6, the improved power semiconductor module packaging structure 100 further comprises at least one set of control terminals 150 for receiving at least one external control signal to determine whether the chips 122 are turned on. In this embodiment, the number of the copper nut terminals 130 is three and the number of the set of control terminals 150 is two (at least one each). In another embodiment, the circuit substrate 120 further comprises at least one electronic component connected to the chip 122, the control terminals 150 or other components to form the power semiconductor module.

Compared with the conventional structures, the structures of FIG. 4 and FIG. 6 of the present invention can better reduce the electromagnetic radiation effect and are more suitable for applications with high power or high current (e.g., more than 400 amperes, but not limited to this).

In summary, the improved power semiconductor module packaging structure disclosed in the present invention can bring the following effects:

1. Greatly reduce electromagnetic radiation; and
2. Be more suitable for large current applications.

What the invention claimed is:

1. An improved power semiconductor module packaging structure, comprising:

a heat sink;

at least one circuit substrate disposed on said heat sink, each said circuit substrate comprising at least one chip, which constitutes a power semiconductor module;

at least one copper nut terminal selectively disposed on said heat sink or said at least one circuit substrate, said at least one copper nut terminal being used as a bridge between an external current and an internal current of said power semiconductor module, wherein said at least one chip is electrically connected to said at least one copper nut terminal through a plurality of wires;

a plastic housing side wall disposed around said heat sink to define a filling space therein, wherein the height of said plastic housing side wall is lower than the height of said at least one copper nut terminal; and an insulating glue injected into said filling space to cover said at least one circuit substrate, the injection height of said insulating glue being lower than the height of said at least one copper nut terminal, wherein said at least one copper nut terminal is used to conduct current.

2. The improved power semiconductor module packaging structure as claimed in claim 1, wherein the type of said at least one chip is one of the following: diode chip, metal oxide semiconductor (MOS) chip, bipolar junction transistor (BJT) chip, insulated gate bipolar transistor (IGBT) chip, or a combination of thereof.

3. The improved power semiconductor module packaging structure as claimed in claim 2, wherein said metal oxide semiconductor (MOS) chip, said bipolar junction transistor (BJT) chip, and said insulated gate bipolar transistor (IGBT) chip of said at least one chip are used as switches.

4. The improved power semiconductor module packaging structure as claimed in claim 2, wherein said diode chip of said at least one chip is used for rectification.

5. The improved power semiconductor module packaging structure as claimed in claim 2, further comprising at least one set of control terminals for receiving at least one external control signal to determine whether said at least one chip is turned on.

6. The improved power semiconductor module packaging structure as claimed in claim 1, wherein said at least one circuit substrate each further comprises at least one electronic component connected to said at least one chip to form the power semiconductor module.

7. An improved power semiconductor module packaging structure, comprising:

a heat sink;

at least one circuit substrate disposed on said heat sink, each said circuit substrate comprising at least one chip, which constitutes a power semiconductor module;

at least one copper nut terminal selectively disposed on said heat sink or said at least one circuit substrate, said at least one copper nut terminal being used as a bridge between an external current and an internal current of said power semiconductor module, wherein said at least one chip is electrically connected to said at least one copper nut terminal through a plurality of wires, and said at least one copper nut terminal is used to conduct current;

a plastic housing side wall disposed around said heat sink to define a filling space therein, wherein the height of said plastic housing side wall is lower than the height of said at least one copper nut terminal; and an insulating glue injected into said filling space to cover said at least one circuit substrate, the injection height of said insulating glue being lower than the height of said at least one copper nut terminal, wherein said at least one chip each is a diode chip and is used for rectification.

* * * * *